(12) United States Patent
Ware

(10) Patent No.: US 9,431,090 B2
(45) Date of Patent: *Aug. 30, 2016

(54) MEMORY SYSTEMS AND METHODS FOR DYNAMICALLY PHASE ADJUSTING A WRITE STROBE AND DATA TO ACCOUNT FOR RECEIVE-CLOCK DRIFT

(71) Applicant: Rambus Inc., Sunnyvale, CA (US)

(72) Inventor: Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/669,919

(22) Filed: Mar. 26, 2015

(65) Prior Publication Data

US 2015/0243342 A1 Aug. 27, 2015

Related U.S. Application Data

(63) Continuation of application No. 14/047,118, filed on Oct. 7, 2013, now Pat. No. 9,007,853, which is a continuation of application No. 13/670,343, filed on Nov. 6, 2012, now Pat. No. 8,553,475, which is a (Continued)

(51) Int. Cl.
*G11C 7/00* (2006.01)
*G11C 11/4076* (2006.01)
(Continued)

(52) U.S. Cl.
CPC ....... *G11C 11/4076* (2013.01); *G06F 13/1689* (2013.01); *G11C 11/409* (2013.01); *G11C 11/40615* (2013.01); *G11C 29/02* (2013.01); *G11C 29/022* (2013.01);
(Continued)

(58) Field of Classification Search
CPC ...... G11C 7/22; G11C 7/1066; G11C 7/1051
USPC ......... 365/193, 189.15, 191, 233.5; 711/105, 711/103
See application file for complete search history.

(56) References Cited

U.S. PATENT DOCUMENTS 5,206,726 A 4/1993 Okuda
5,247,485 A * 9/1993 Ide .......................... G11C 8/04
365/189.04

(Continued)

FOREIGN PATENT DOCUMENTS

DE 102005019041 A1 11/2006

OTHER PUBLICATIONS

"Double Data Rate (DDR) SDRAM Specification," JEDEC Standard, JESD79C, Revision of JESD79B, JEDEC Solid State Technology Association, Mar. 2003. 81 pages.

(Continued)

*Primary Examiner* — Connie Yoha
(74) *Attorney, Agent, or Firm* — Silicon Edge Law Group LLP; Arthur J. Behiel

(57) ABSTRACT

A memory system includes a memory controller that writes data to and reads data from a memory device. A write data strobe accompanying the write data indicates to the memory device when the write data is valid, whereas a read strobe accompanying data from the memory device indicates to the memory controller when the read data is valid. The memory controller adaptively controls the phase of the write data strobe to compensate for timing drift at the memory device. The memory controller uses read signals as a measure of the drift.

20 Claims, 5 Drawing Sheets

Related U.S. Application Data continuation of application No. 13/111,667, filed on May 19, 2011, now Pat. No. 8,305,821, which is a continuation of application No. 12/514,864, filed as application No. PCT/US2007/000561 on Jan. 9, 2007, now Pat. No. 7,948,812.

(60) Provisional application No. 60/860,353, filed on Nov. 20, 2006.

(51) Int. Cl.
*G06F 13/16* (2006.01)
*G11C 29/02* (2006.01)
*G11C 29/50* (2006.01)
*G11C 11/406* (2006.01)
*G11C 11/409* (2006.01)
*G11C 7/22* (2006.01)
*G11C 7/10* (2006.01)
*G11C 7/04* (2006.01)

(52) U.S. Cl.
CPC .......... *G11C 29/023* (2013.01); *G11C 29/028* (2013.01); *G11C 29/50012* (2013.01); *G11C 7/04* (2013.01); *G11C 7/1051* (2013.01); *G11C 7/1072* (2013.01); *G11C 7/22* (2013.01)

(56) References Cited

U.S. PATENT DOCUMENTS

| | | | |
|---|---|---|---|
| 5,642,387 A | 6/1997 | Fukasawa | |
| 5,867,541 A | 2/1999 | Tanaka et al. | |
| 6,178,139 B1 | 1/2001 | Hirobe et al. | |
| 6,229,757 B1 | 5/2001 | Nagata et al. | |
| 6,314,050 B1 | 11/2001 | Yi et al. | |
| 6,407,963 B1 | 6/2002 | Sonoda et al. | |
| 6,498,766 B2 | 12/2002 | Lee et al. | |
| 6,504,790 B1 | 1/2003 | Wolford | |
| 6,563,759 B2 | 5/2003 | Yahata et al. | |
| 6,570,944 B2 | 5/2003 | Best et al. | |
| 6,603,686 B2 | 8/2003 | Yoo et al. | |
| 6,680,866 B2 | 1/2004 | Kajimoto | |
| 6,680,869 B2 | 1/2004 | Sonoda et al. | |
| 6,707,723 B2 | 3/2004 | Jeong | |
| 6,728,162 B2 | 4/2004 | Lee et al. | |
| 6,760,261 B2 | 7/2004 | Partsch et al. | |
| 6,813,217 B2 | 11/2004 | Schneider et al. | |
| 6,819,616 B2 | 11/2004 | La et al. | |
| 6,836,503 B2 | 12/2004 | Best et al. | |
| 6,862,248 B2 | 3/2005 | Shin | |
| 6,898,682 B2 | 5/2005 | Welker et al. | |
| 6,906,968 B2 | 6/2005 | Kim et al. | |
| 6,909,643 B2 | 6/2005 | Kwean | |
| 6,909,678 B2 | 6/2005 | Morishima | |
| 6,989,872 B2 | 1/2006 | Nakatsuji et al. | |
| 7,016,237 B2 | 3/2006 | Lee et al. | |
| 7,016,256 B2 | 3/2006 | Yoon et al. | |
| 7,038,971 B2 | 5/2006 | Chung | |
| 7,042,799 B2 | 5/2006 | Cho | |
| 7,062,625 B1 * | 6/2006 | Shrader ................ | G11C 7/1051 711/105 |
| 7,106,655 B2 | 9/2006 | Lee | |
| 7,111,111 B2 | 9/2006 | Neuman et al. | |
| 7,142,470 B2 | 11/2006 | Tseng | |
| 7,158,443 B2 | 1/2007 | Lin | |
| 7,366,862 B2 | 4/2008 | Nystuen et al. | |
| 7,636,828 B2 * | 12/2009 | VanZante ............ | G06F 13/1689 365/230.03 |
| 7,688,672 B2 | 3/2010 | Best et al. | |
| 7,948,812 B2 * | 5/2011 | Ware ................... | G06F 13/1689 365/185.05 |
| 8,305,821 B2 * | 11/2012 | Ware ................... | G06F 13/1689 365/185.05 |
| 8,473,811 B2 * | 6/2013 | Jo ........................ | G06F 13/1668 714/763 |
| 8,553,475 B2 * | 10/2013 | Ware ................... | G06F 13/1689 365/189.15 |
| 8,589,654 B2 * | 11/2013 | Takai ................... | G11C 7/1066 711/105 |
| 9,007,853 B2 * | 4/2015 | Ware ................... | G06F 13/1689 365/189.15 |
| 2001/0043505 A1 | 11/2001 | Lee et al. | |
| 2002/0118575 A1 | 8/2002 | Sonoda et al. | |
| 2002/0122348 A1 | 9/2002 | Lee et al. | |
| 2002/0141331 A1 | 10/2002 | Mate et al. | |
| 2003/0053471 A1 | 3/2003 | Stief | |
| 2003/0067812 A1 | 4/2003 | Kajimoto | |
| 2003/0086303 A1 | 5/2003 | Jeong | |
| 2003/0179619 A1 | 9/2003 | La et al. | |
| 2003/0199262 A1 | 10/2003 | Chung | |
| 2003/0200407 A1 | 10/2003 | Osaka et al. | |
| 2003/0217225 A1 | 11/2003 | Jang et al. | |
| 2003/0218933 A1 | 11/2003 | Schneider et al. | |
| 2004/0008069 A1 | 1/2004 | Welker et al. | |
| 2004/0056697 A1 | 3/2004 | Partsch et al. | |
| 2004/0190353 A1 | 9/2004 | Kim et al. | |
| 2004/0213073 A1 | 10/2004 | Yoon et al. | |
| 2004/0218424 A1 | 11/2004 | Kwean | |
| 2004/0264290 A1 | 12/2004 | Shin | |
| 2004/0268016 A1 | 12/2004 | Lee et al. | |
| 2004/0268028 A1 | 12/2004 | Lee | |
| 2005/0010834 A1 | 1/2005 | Chu | |
| 2005/0024984 A1 | 2/2005 | Lee et al. | |
| 2005/0141331 A1 | 6/2005 | Cho | |
| 2005/0276146 A1 | 12/2005 | Ha et al. | |
| 2006/0077730 A1 | 4/2006 | Jakobs et al. | |
| 2006/0092721 A1 | 5/2006 | Lee | |
| 2006/0114742 A1 | 6/2006 | Salmon et al. | |
| 2006/0140021 A1 | 6/2006 | Ha et al. | |
| 2012/0278539 A1 * | 11/2012 | Hosogaya ............ | G11B 20/10 711/103 |

OTHER PUBLICATIONS

"Flash Memory," Wikipedia, the free encyclopedia, last modified Aug. 26, 2006. 5 pages.
"Wear Levelling," Wikipedia, the free encyclopedia, last modified Aug. 13, 2006. 1 page.
Allan, Graham, "The Love/Hate Relationship with DDR SDRAM Controllers—Love the Cheap Memory, Hate the Complex Controller," D&R Headline News, Copyright 2006. 4 pages.
PCT International Search Report dated Jun. 4, 2009 in International Application No. PCT/US2007/000561. 8 pages.

* cited by examiner

MEMORY SYSTEMS AND METHODS FOR DYNAMICALLY PHASE ADJUSTING A WRITE STROBE AND DATA TO ACCOUNT FOR RECEIVE-CLOCK DRIFT

FIELD

The subject matter disclosed herein relates generally to circuits for communicating data between integrated circuits, and in particular to circuits and associated methods for phase shifting data and strobe signals to accommodate drift in a clock signal.

BACKGROUND

SDRAM, or synchronous dynamic random access memory, is a type of memory integrated circuit that waits for rising or falling edges of a timing reference signal before responding to control inputs. Typical examples of timing reference signals include clock signals and strobe signals. DDR SDRAM, or double-data-rate SDRAM, achieves greater bandwidth than ordinary SDRAM by transferring data on both the rising and falling edges of timing reference signals.

Many DDR SDRAMs that produce data also produce a data strobe, called "DQS" ("data query strobe"), to indicate that data is valid. The DQS is transmitted, along with data, from the memory controller to the DDR SDRAM during write operations and from the DDR SDRAM to the memory controller during read operations. When driven by the memory controller, DQS is center-aligned with the write data. When driven by the memory, DQS is edge-aligned with the read data.

The timing for write operations is often defined in a specification. For example, in at least some DDR SDRAM specifications, the time $t_{DQSS}$ between a write command and the first corresponding rising edge of DQS is specified with a relatively wide range (from 75% to 125% of one clock cycle). The time $t_{DQSS}$ might be described as a window during which the specified DDR SDRAM "looks for" data on a data bus. Devices issuing a write command to such a DDR SDRAM are expected to drive DQS in such a way that the signal arrives at the DRAM pins at a clock edge, plus or minus 25% of one clock cycle.

Designing a memory controller that provides the write DQS within a timing window $t_{DQSS}$ can be complicated by the fact that the memory controller is desired to operate in many different system topologies. For example, relatively short, lightly loaded channels may lead a DQS to arrive too early; whereas relatively long, highly loaded channels may lead a DQS to arrive too late. In either case, the early or late DQS may violate the specification requirement for the timing window $t_{DQSS}$, and potentially lead to an error. Other system variations, such as those that result from process variations and temperature and supply-voltage fluctuations, also affect signal propagation delays and therefore further complicate the task of maintaining the relative timing of the DQS and the write signal within the requisite window.

Meeting the DQS timing window $t_{DQSS}$ can be particularly daunting if the memory device does not include clock recovery circuitry to stabilize the device-side clock signal used to time the write signal. DDR DRAMs adapted for use in mobile devices often lack clock-recovery circuitry, which advantageously reduces standby power and standby-active transition latency. Unfortunately, these benefits come at the cost of increased write signal drift, leading to an increased probability of violating the $t_{DQSS}$ timing parameter.

BRIEF DESCRIPTION OF THE DRAWINGS

The subject matter disclosed is illustrated by way of example, and not by way of limitation, in the figures of the accompanying drawings and in which like reference numerals refer to similar elements and in which:

FIG. 3 depicts an embodiment of memory system 100 of FIG. 1 in more detail, like-identified elements being the same or similar.

DETAILED DESCRIPTION

Figure 1:
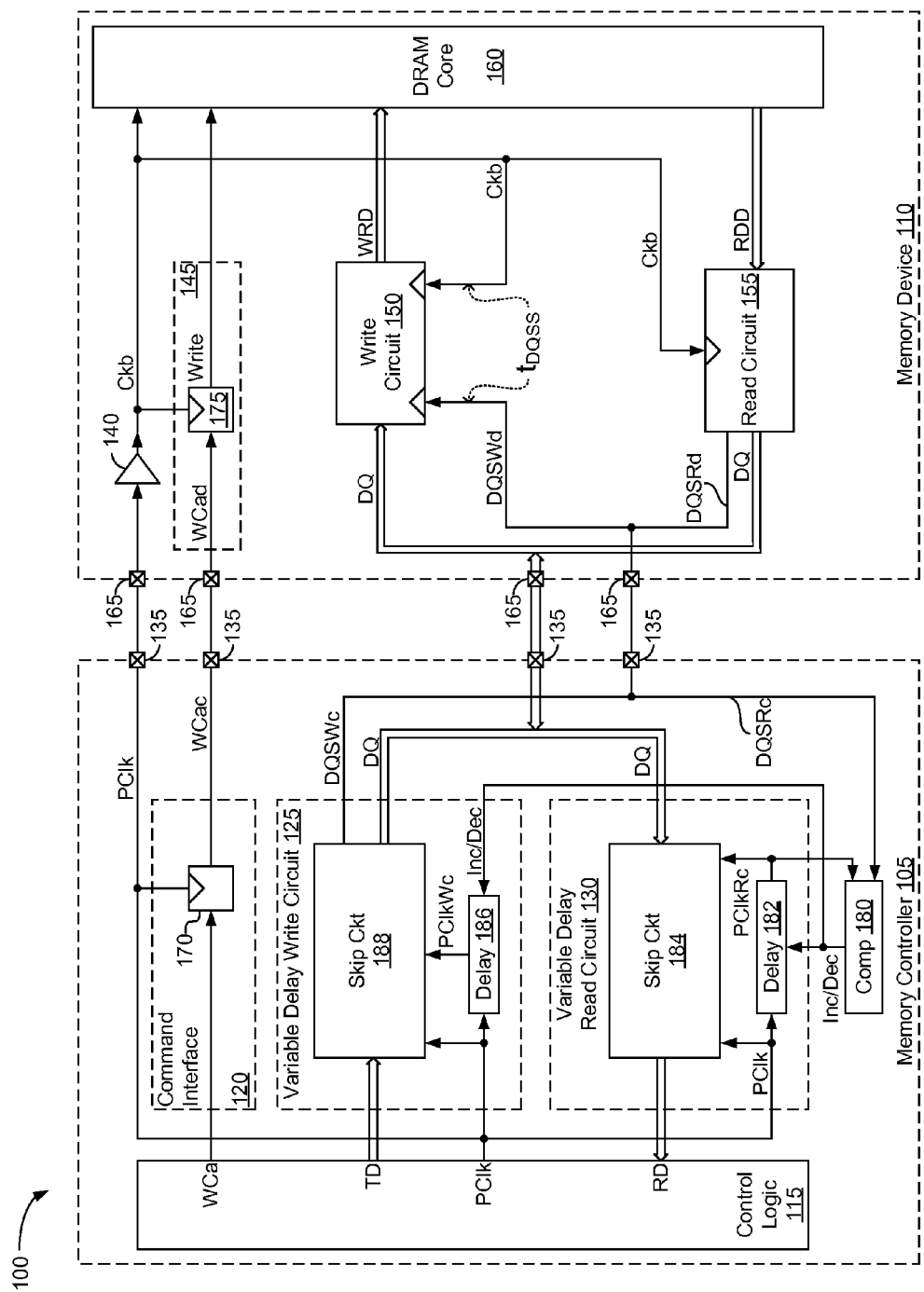
FIG. 1 depicts a memory system 100, including a memory controller 105 and at least one memory device 110.

FIG. 1 depicts a memory system 100, including a memory controller 105 and at least one memory device 110. In accordance with the depicted embodiment, memory controller 105 adaptively controls the timing of the write DQS to compensate for timing drift of write signals within memory device 110, and therefore to prevent violations of the $t_{DQSS}$ timing window. Read DQS signals from memory device 110 provide a measure of write-signal timing. Memory controller 105 monitors the phase of read DQS signals to sense and correct for write-signal drift.

Memory controller 105 includes control logic 115 that issues address and control signals to a command interface 120, conveys byte-wide transmit-data signals TD to a variable-delay write circuit 125, and receives byte-wide receive-data signals RD from a variable delay read circuit 130. A distributed clock signal PClk defines the clock domain for control logic 115, interface 120, and portions of variable-delay write and read circuits 125 and 130. Respective write and read phase-reference signals PClkWc and PClkRc, each a phase shifted version of clock signal PClk in this embodiment, respectively define the write and read clock domains.

Memory device 110, a strobed DDR DRAM in this example, includes a clock distribution network 140, a command decoder 145, a write circuit 150, and a read circuit 155, all of which communicate with a DRAM core 160. Memory device 110 additionally includes a plurality of pads 165 coupled to corresponding pads 135 of controller 105. In this example, one of pads 135 is a shared strobe terminal that both conveys the write strobe to and receives the read strobe from memory device 110, and data lines DQ share collections of pads 135 to transmit and receive data. Separate unidirectional data lines or separate strobe lines can be used for transmit and receive operations in other embodiments.

Clock signal PClk from control logic 115 times both the memory controller and the memory device. The clock path between memory controller 105 and the various components of memory device 110, including clock distribution network 140, impose a clock delay, so the device-side clock domain is defined by a distributed clock signal Ckb that may not be phase aligned with controller-side clock signal PClk. Including a clock-recovery circuit in network 140 can ameliorate this phase misalignment; however, clock recovery circuitry consumes standby power and increases the time required to activate the memory device, and is therefore undesirable for some applications.

To perform a write operation, control logic 115 issues the appropriate address and control signals to command interface 120. The following discussion is limited to write command WCa for ease of illustration, as the remaining address and control signals will be readily understood by those of skill in the art. Command interface 120 includes a synchronous storage element 170 that times write command WCa to clock signal PClk. The resulting signal WCac is then conveyed to command decoder 145 as signal WCad. (The present disclosure employs a naming convention in which signals ending with a lower-case "c" are control-side signals, and signals ending in a lower-case "d" are memory-device-side signals. This naming convention recognizes that signals communicated between memory controller 105 and memory device 110 shift in phase.) Synchronous storage element 175 within command decoder 145 retimes control signal WCad to the device-side time domain defined by signal Ckb to create a write signal Write to core 160.

During a write operation, variable-delay write circuit 125 issues, on a write-strobe terminal DQSWc, a like-named, center-aligned write strobe with write data DQ to memory device 110. (In general, signals and their associated nodes carry the same designations. Whether a given moniker refers to a signal or a corresponding node will be clear from the context.) The timing of the data and strobe signals is based upon a clock signal PClkWc, a delayed version of clock signal PClk. As detailed below, the delay imposed upon clock signal PClkWc is set to ensure system 100 meets the $t_{DQSS}$ requirement imposed by the DDR SDRAM specification.

At memory device 110, write circuit 150 captures the write data DQ from memory controller 105 using a strobe DQSWd, a delayed version of DQSWc, and retimes the captured data to the memory-device clock domain as data WRD. As noted previously, per the $t_{DQSS}$ specification the time between the write command Write and the first corresponding rising edge of DQS is specified as from 75% to 125% of one clock cycle. In memory device 110, this timing window $t_{DQSS}$ corresponds to the phase difference between the strobe DQSWd and the edge of clock signal Ckb that accompanies write command Write.

During a read operation, read circuit 155 issues a read data strobe DQSRd edge-aligned with data DQ to memory controller 105. Variable-delay read circuit 130 then captures the read data DQ using a clock signal PClkRc phase aligned with a delayed version of read strobe DQSRd, controller-side read strobe DQSRc. Variable-delay read circuit 130 then retimes the captured data to the controller clock domain PClk as data RD. A phase comparator 180 maintains the alignment between clock signal PClkRc and read strobe DQSRc by occasionally comparing the phases of these two signals and phase adjusting clock signal PClkRc as needed to reduce any phase difference. In this embodiment, comparator 180 uses a control signal Inc/Dec to adjust the signal-propagation delay through a delay circuit 182 to phase adjust clock signal PClkRc. Control signal Inc/Dec is also used in this embodiment to advance or retard the write clock domain defined by clock signal PClkWc.

In variable-delay write circuit 125, a skip circuit 188 samples data signals TD from control logic 115 using clock signal PClk and retimes the captured data to clock signal PClkWc, a delayed version of clock signal PClk. The delay imposed by delay circuit 186 is set to optimize the timing of controller-side strobe DQSWc, and thus the device-side strobe DQSWd, to maintain the delay between the strobe DQSWd and the edge of clock signal Ckb that accompanies write command Write within the specified $t_{DQSS}$ window.

Figure 2:
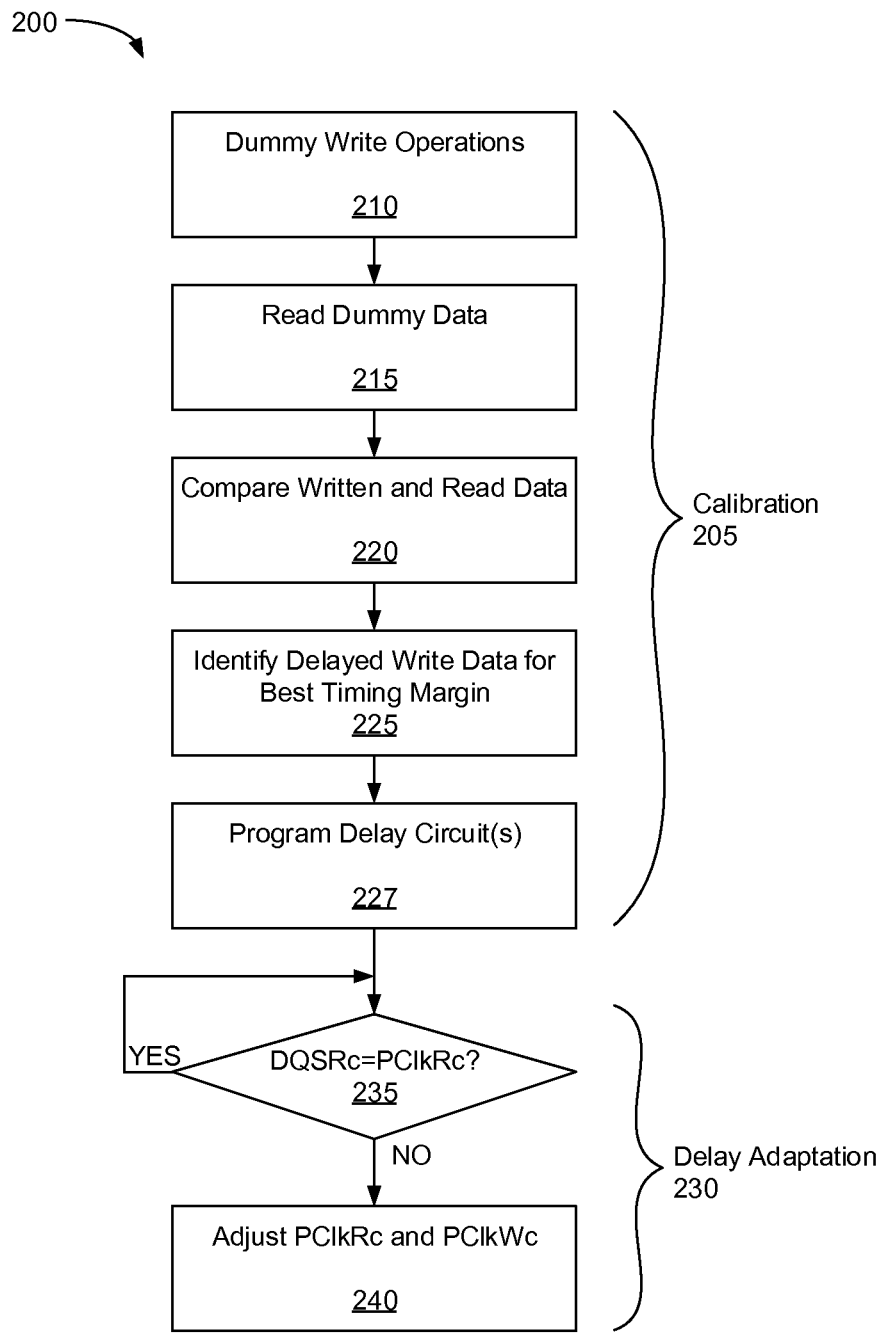
FIG. 2 depicts a flowchart 200 illustrating a process of calibrating and adaptively adjusting memory controller 105 in accordance with one embodiment.

FIG. 2 depicts a flowchart 200 illustrating a process of calibrating and adaptively adjusting memory controller 105 in accordance with one embodiment. In a calibration process 205 that may be performed at initialization or another time, memory controller 105 initiates a series of dummy write operations 210 to memory device 110, each write operation using different delayed versions of a write data signal. In this step, memory controller 105 may write pre-specified data bytes to memory device 110, independent of any data needs of components of the memory system or other higher layer machine-readable code; these writes may be performed at power-up, or other intervals in which the memory component was otherwise not being utilized.

Following completion of the dummy write operations 210, controller 105 reads the data of all dummy write operations from memory device 110 (step 215) and compares the read data with a copy of the originally written data to identify successful write operations (step 220). Timing information corresponding to the successful dummy write operations allows for identification of the particular delayed write data signal providing the best timing margin (step 225). The logic values that identify the delayed write data signal providing the best timing margin may then be programmed into one or both of delay circuits 182 and 186 (step 227).

Delay adaptation 230 follows calibration 205 to accommodate phase drift that occurs over time due to e.g. temperature and supply-voltage fluctuations. Per decision 235, phase comparator 180 in controller 105 occasionally compares read strobe DQSRc with clock signal PClkRc during read operations. If these two signals are out of phase, comparator 180 adjusts delay circuit 182 as needed to maintain synchronization between the two signals (step 240). In some embodiments, delay circuit 182 can be calibrated to introduce a phase offset (e.g., 90 degrees) that is adaptively maintained.

In embodiments where the adjustment is dynamic, a minimum read command density or rate may be needed. In particular, because the adjustment only occurs when read data is received by memory controller 105, excessive timing drift may occur if read commands are issued infrequently. In some embodiments, therefore, control logic 115 may issue one or more supplemental read commands to the memory device 110 if a time interval since a last read command exceeds a predetermined value.

Turning to variable-delay write circuit 125, delay circuit 186 is set at initialization to maintain the $t_{DQSS}$ parameter within the specified window as discussed above. Once set, however, the $t_{DQSS}$ window can vary with temperature and supply voltage fluctuations. Clock distribution network 140, a primary contributor to such variations, allows clock signal Ckb to drift with respect to write strobe DQSWd. Storage element 175 synchronizes the Write command to clock signal Ckb, so the Write command likewise drifts with respect to write strobe DQSWd. If substantial, such drift can cause memory system 100 to violate the required $t_{DQSS}$ window.

Recall that time $t_{DQSS}$ is the time between the strobe DQSWd and the edge of clock signal Ckb that accompanies write command Write. Because the write command Write is timed to clock signal Ckb, clock signal Ckb provides a measure of write-signal drift. Read strobe signal RQSRd is also timed to clock signal Ckb, and is therefore also a measure of write-signal drift. In other words, both write command Write and read strobe RQSRd are timed to clock signal Ckb, and therefore drift together with clock signal Ckb. Memory controller 105 takes advantage of this relationship by altering the phase of write strobe DQSWc to account for drift in the read strobe signal RQSRd, and thus to account for drift in clock signal Ckb that might otherwise induce a violation in the specified $t_{DQSS}$ window.

Comparator 180 issues control signals Inc/Dec to delay circuit 182 to maintain phase alignment between clock signal PClkRc and the receive strobe DQSRc. These phase adjustments accommodate phase changes in receive strobe DQSRc that are induced by changes in the phase of clock signal Ckb, and are consequently similar in magnitude to the phase changes experienced by write command Write. Control signals Inc/Dec are also conveyed to delay circuit 186 within variable-delay write circuit 125 to adjust clock signal PClkWc by the same phase change imposed by delay circuit 182 to accommodate changes in strobe DQSRc. Write strobe DQSWc is timed to clock signal PClkWc, and so is likewise phase adjusted to accommodate drift in the receive strobe DQSRc, and thus the similar drift in write signal Write.

Figure 3:
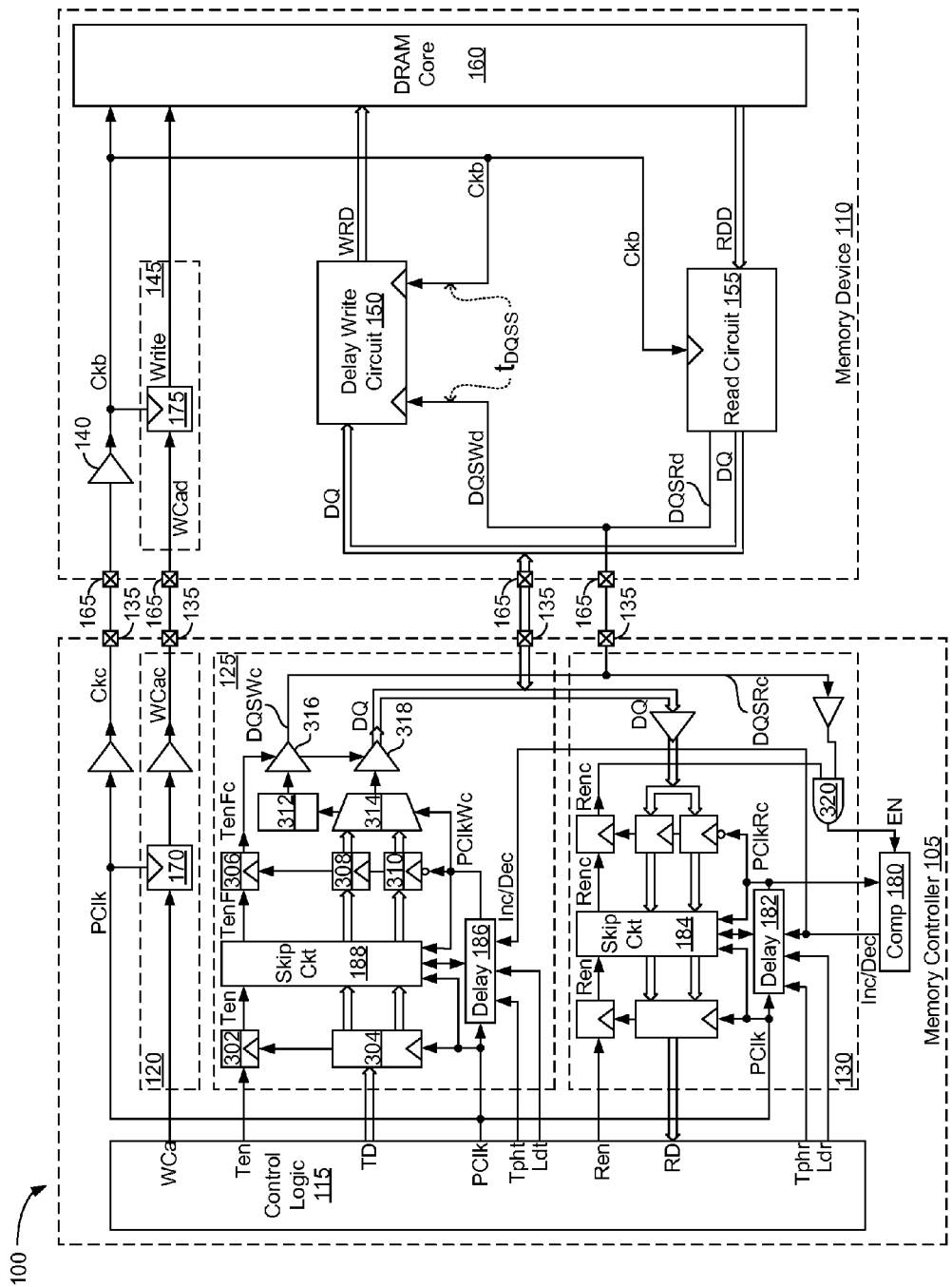

FIG. 3 depicts an embodiment of memory system 100 of FIG. 1 in more detail, like-identified elements being the same or similar. In addition to delay 186 and skip circuit 188 of FIG. 1, variable-delay write circuit 125 includes input registers 302 and 304 timed to clock domain PClk, output registers 306, 308, and 310 timed to the PClkWc domain, a strobe-pattern generator 312, a multiplexer 314, and a pair of output buffers 316 and 318. Registers 302 and 304 capture transmit-enable signal Ten and eight-bit-wide data TD, respectively, upon rising edges of clock signal PClk. Skip circuit 188 retimes the outputs of registers 302 and 304 to the PClkWc domain and provides the retimed transmit-enable signal TenF to register 306 and four-bits of data TD to each of registers 308 and 310 for capture by respective rising and falling edges of clock signal PClk. Multiplexer 314 then alternately transmits the contents of registers 308 and 310 via driver 318 to memory device 110. Each time multiplexer 314 issues a burst of parallel data bits, pattern generator 312 transmits a write-strobe pattern (e.g., 1010) DQSWc to accompany the data to memory device 110. Both the transmitted strobe DQSWc and the write data DQ are timed to PClkWc, the phase of which can be adjusted relative to clock signal PClk by asserting a load signal Ldt to capture an applied transmit phase-adjustment signal Tpht.

Variable-delay read circuit 130 may function in substantially the same manner as variable-delay write circuit 125, so a detailed discussion of variable-delay read circuit 130 is omitted for brevity. In summary, variable-delay read circuit 130 transfers read data DQ from clock domain PClkRc to clock domain PClk in the presence of an asserted receive-enable signal Ren. An AND gate 320 issues an enable signal EN that allows comparator 180 to update the delay calibration for delay elements 182 and 186 in the presence of a version of the read-enable signal, Renc, retimed into the PClkRc clock domain. The timing of clock signal PClkRc can be adjusted by asserting a load signal Ldr to capture an applied receive phase-adjustment signal Tphr.

In an alternative embodiment (not shown), variable-delay read circuit 130 may include a FIFO block for receiving the read data, with the output of gate 320 causing the read data to be loaded into the FIFO. The read data may then be unloaded from the FIFO as receive-data signals RD. Though clock signal PClkRc is not used to sample read data in this alternative embodiment, comparator 180 and delay element 182 may still be included for updating the write delay.

Figure 4:
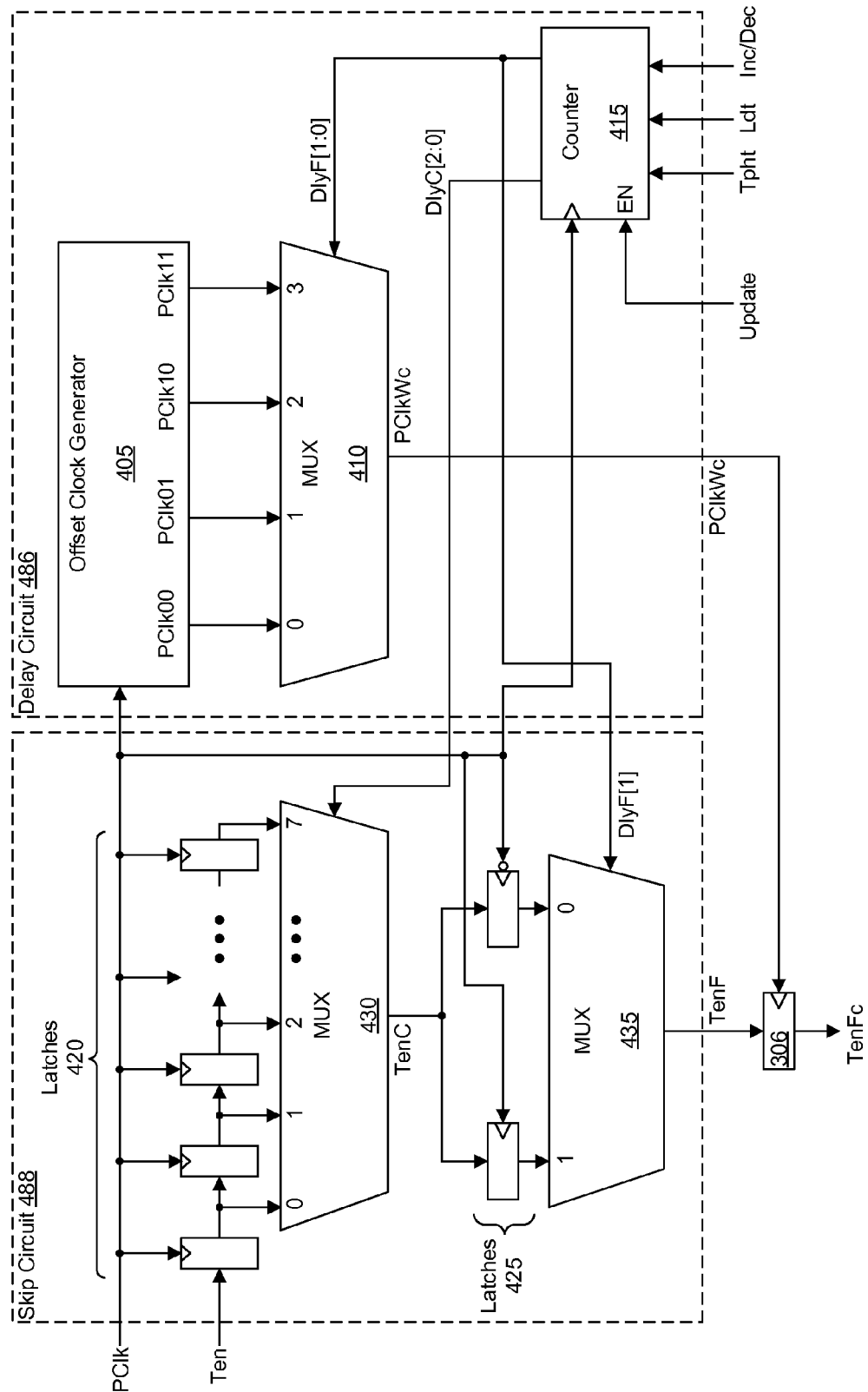
FIG. 4 depicts embodiments of delay circuit 486 and skip circuit 488, which may be used to implement the delay circuit 186 and skip circuit 188 of FIGS. 1 and 3.

FIG. 4 depicts embodiments of delay circuit 486 and skip circuit 488, which may be used as delay circuit 186 and skip circuit 188 of FIGS. 1 and 3. For simplicity, the discussion of skip circuit 488 is limited to the phase shifting of transmit-enable signal Ten: variable-delay write circuit 125 similarly retimes other signals between the PClk and PClkWc domains.

Delay circuit 486 includes an offset clock generator 405, a multiplexer 410, and an n-bit counter 415. Skip circuit 488 includes collections of latches 420 and 425 and a pair of multiplexers 430 and 435. Register 306 from FIG. 3 is also included in FIG. 4 to show how the respective outputs TenF and PClkWc of skip circuit 488 and delay circuit 486 may be used to produce a transmit enable signal TenFc retimed to the PClkWc domain.

Counter 415, a 5-bit counter in the depicted embodiment, is loaded with a calibrating value at initialization, as detailed above in connection with FIG. 2. The five bits loaded into counter 405 are presented on its output as course delay bits DlyC[2:0] and fine delay bits DlyF[1:0]. These delay signals together determine the delays imposed on the transmit-enable signal Ten and clock signal PClk to obtain the adjusted enable signal TenFc and write clock signal PClkWc. These signals can then be phase adjusted as needed by incrementing or decrementing counter 415 as described above in connection with FIGS. 1 and 2.

Figure 5:
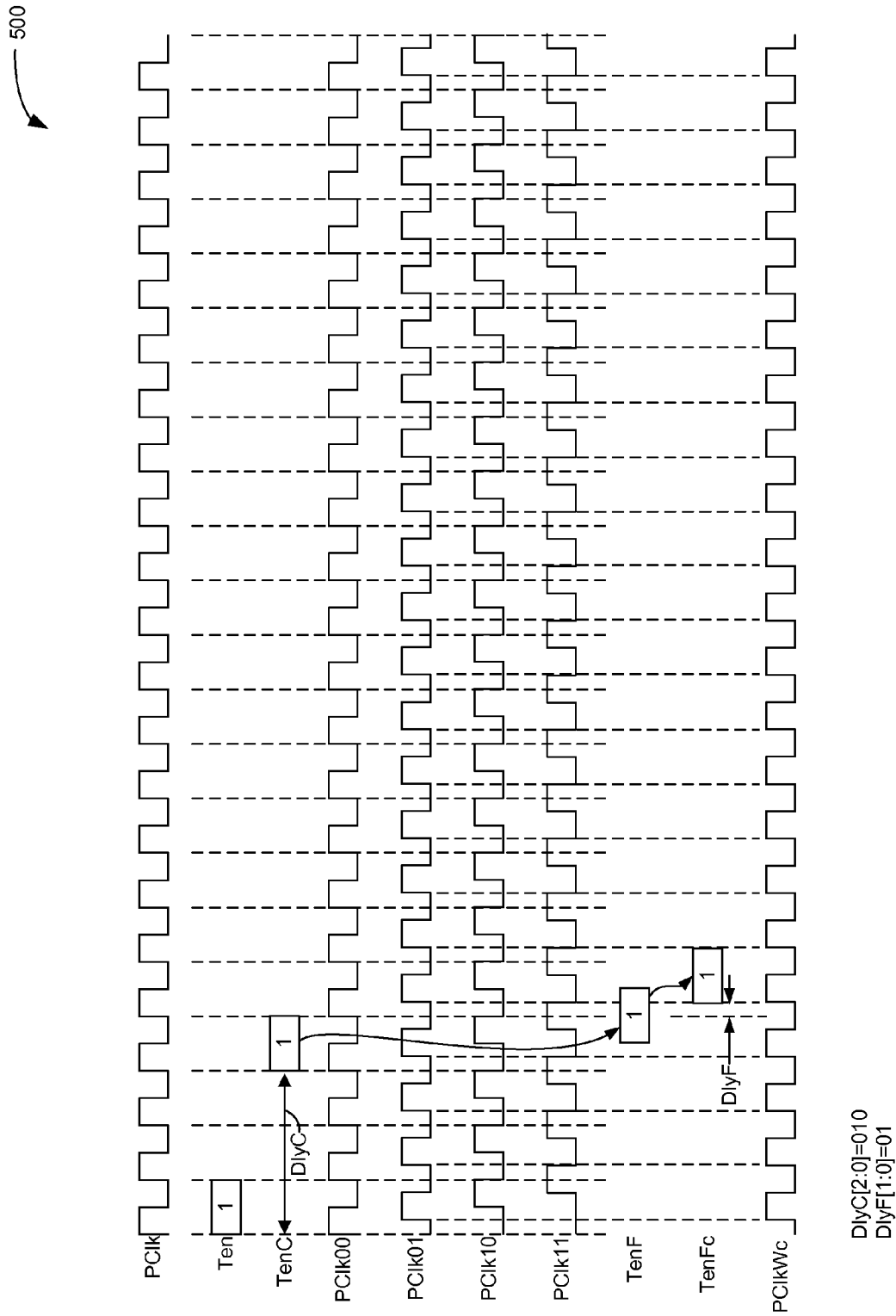
FIG. 5 is a timing diagram 500 illustrating operation of skip circuit 488 and delay circuit 486 of FIG. 4 for the case in which DlyC[2:0] is 010 and DlyF[1:0] is 01.

FIG. 5 is a timing diagram 500 illustrating operation of skip circuit 488 and delay circuit 486 of FIG. 4 for the case in which DlyC[2:0] is 010 and DlyF[1:0] is 01. DlyC[2:0] is coupled to the select port of multiplexer 430, and causes multiplexer 430 to select its #2 (010) input to provide output signal TenC, a version of transmit enable signal Ten delayed by three clock cycles via latches 420. Signal TenC can thus be delayed in increments of one PClk cycle by appropriate selection of DlyC[2:0] values. Latches 425 then present the coarsely adjusted enable signal TenC to the inputs of multiplexer 435 on both the rising and falling edges of clock signal PClk. Because DlyF[1] is a zero in this example, multiplexer 435 selects the output of the one of latches 425 with an inverted clock input. The output TenF from multiplexer 435 therefore takes the value of TenC following the next falling edge of clock signal PClk.

Offset clock generator 405 provides four clock signals PClk00, PClk01, PClk10, and PClk11 having different phase offsets relative to the clock signal PClk. PClk00, PClk01, PClk10, and PClk11 are delayed with respect to the PClk signal by 0, 0.25, 0.5, and 0.75 clock cycles, respectively. Multiplexer 410 then selects one of these four clock signals based upon the value of fine delay signal DlyF[1:0] to produce the phase-shifted write clock signal PClkWc. DlyF[1:0] is 01 in the present example, so multiplexer 410 outputs signal PClk01 as write clock signal PClkWc. Register 306 captures the adjusted transmit-enable signal TenF on the rising edge of clock signal PClkWc to produce the final transmit enable signal TenFc phase adjusted by 0.25 clock cycles into the PClkWc domain. TenFc and PClkWc can be similarly phase adjusted 0, 0.5, and 0.75 by setting fine delay signal DlyF[1:0] to 00, 10, and 11, respectively.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example, the skip and delay circuitry disclosed herein are examples, but are not limiting. Many other circuits and methods for crossing clock domains are well known to those of skill in the art. Embodiments of the invention may be adapted for use with multi-pulse-amplitude-modulated (multi-PAM) signals. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A method of operation of a memory controller device that controls a memory device, the method comprising:
   generating, at the memory controller device, a write strobe having a write-strobe phase;
   receiving, from the memory device, read data accompanied by a read strobe having a read-strobe phase; and
   adjusting the write-strobe phase in response to the read-strobe phase.

2. The method of claim 1, further comprising timing the write strobe to a write clock signal and issuing write data and the write strobe to the memory device.

3. The method of claim 1, further comprising generating, at the memory controller device, a read clock signal having a read-clock phase, and adjusting the read-clock phase in response to the read-strobe phase.

4. The method of claim 3, further comprising deriving the write strobe and the read clock signal from a common clock signal having a common-clock phase.

5. The method of claim 4, further comprising retiming the read data to the common-clock phase.

6. The method of claim 1, further comprising issuing a supplemental read command.

7. The method of claim 6, further comprising monitoring for a read command density and issuing the supplemental read command should the read command density fall below a minimum.

8. A memory controller comprising:
   a command interface to send read commands and write commands timed to a clock signal;
   a write circuit to issue write data and a write strobe having a write-strobe phase;
   a read circuit to receive a read data and a read strobe having a read-strobe phase; and
   a phase comparator to adjust the write-strobe phase in response to the read-strobe phase.

9. The memory controller of claim 8, the phase comparator to compare the read-strobe phase with a read clock signal and adjust the write-strobe phase responsive to phase differences between the read clock signal and the read-strobe phase.

10. The memory controller of claim 9, further comprising a first delay circuit to delay the clock signal to produce the read clock signal.

11. The memory controller of claim 10, further comprising a second delay circuit to delay the clock signal to produce a write clock signal, the write clock signal to time the write-strobe phase.

12. The memory controller of claim 11, wherein the phase comparator issues a phase control signal to the first delay circuit and the second delay circuit.

13. The memory controller of claim 11, further comprising control logic to issue the clock signal.

14. A memory controller comprising:
   a write circuit to transmit a write strobe having a write-strobe phase;
   a read circuit to receive a read data signal accompanied by a read strobe having a read-strobe phase; and
   means for adjusting the write-strobe phase in response to the read-strobe phase.

15. The memory controller of claim 14, the means for adjusting including a phase comparator to compare the read strobe with a read clock signal.

16. The memory controller of claim 15, further comprising means for delaying the write-strobe phase responsive to the comparing of the read strobe with the read clock signal.

17. The memory controller of claim 16, further comprising means for deriving the write strobe and the read strobe from a common clock signal.

18. The memory controller of claim 14, further comprising means for issuing a supplemental read command.

19. The memory controller of claim 18, further comprising means for monitoring for a read command density and issuing the supplemental read command should the read command density fall below a minimum.

20. The memory controller of claim 14, further comprising means for issuing dummy write operations using different delayed versions of a write data signal.

* * * * *